United States Patent [19]

Lu

[11] Patent Number: 4,649,625  
[45] Date of Patent: Mar. 17, 1987

[54] DYNAMIC MEMORY DEVICE HAVING A SINGLE-CRYSTAL TRANSISTOR ON A TRENCH CAPACITOR STRUCTURE AND A FABRICATION METHOD THEREFOR

[75] Inventor: Nicky C. Lu, Yorktown Heights, N.Y.

[73] Assignee: International Business Machines Corporation, Armonk, N.Y.

[21] Appl. No.: 789,675

[22] Filed: Oct. 21, 1985

[51] Int. Cl.[4] .................... H01L 27/10; H01L 29/78; G11C 11/34
[52] U.S. Cl. ....................... 29/571; 357/23.6; 357/51; 29/576 C; 29/576 E; 29/577 C; 29/580
[58] Field of Search ............ 29/576 C, 576 J, 576 E, 29/580, 577 C, 571, 576 W; 357/23.6, 51

[56] References Cited

U.S. PATENT DOCUMENTS

| | | | |
|---|---|---|---|
| 3,421,055 | 1/1969 | Bean et al. | 317/234 |
| 4,327,476 | 5/1982 | Iwai et al. | 29/571 |
| 4,353,086 | 10/1982 | Jaccodine et al. | 357/51 |
| 4,397,075 | 8/1983 | Fatula, Jr. et al. | 29/571 |
| 4,462,847 | 6/1984 | Thompson et al. | 148/174 |

FOREIGN PATENT DOCUMENTS

| | | | |
|---|---|---|---|
| 0108390 | 5/1984 | European Pat. Off. | 357/23.6 |
| 0003242 | 1/1983 | Japan | 29/576 E |
| 0003269 | 1/1983 | Japan | 357/23.6 |
| 0137245 | 8/1983 | Japan . | |
| 019366 | 1/1984 | Japan | 357/23.6 |
| 0128658 | 7/1985 | Japan | 357/23.6 |

OTHER PUBLICATIONS

J. H. Douglas, 'The Route to 3-D Chips', High Technology, Sep. 1983, pp. 55–59.
Dynamic RAM Cell with Merged Drain and Storage, IBM Technical Disclosure Bulletin, vol. 27, No. 11, Apr. 1985, pp. 6694–6697.

*Primary Examiner*—Brian E. Hearn
*Assistant Examiner*—Tom Thomas
*Attorney, Agent, or Firm*—John J. Goodwin

[57] ABSTRACT

Dynamic random access memory (DRAM) devices are taught wherein individual cells, including an access transistor and a storage capacitor are formed on a single-crystal semiconductor chip, and more particularly a three-dimensional dynamic random access memory (DRAM) device structure is described having a single-crystal access transistor stacked on top of a trench capacitor and a fabrication method therefor wherein crystallization seeds are provided by the single-crystal semiconductor area surrounding the cell and/or from the vertical sidewalls of the trench and wherein the access transistor is isolated by insulator. In the structure, a trench is located in a p+ type substrate containing heavily doped N+ polysilicon. A composite film of $SiO_2/Si_3N_4/SiO_2$ is provided for the capacitor storage insulator. A thin layer of $SiO_2$ is disposed over the polysilicon. A lightly doped p-type epi silicon layer is located over the substrate and $SiO_2$ layer. The access transistor for the memory cell is located on top of the trench capacitor. An N+ doped material connects the source region of the transistor to the polysilicon inside the trench. A medium doped p-region on top of the trench surface may be provided in case there is any significant amount of leakage current along the trench surface.

7 Claims, 10 Drawing Figures

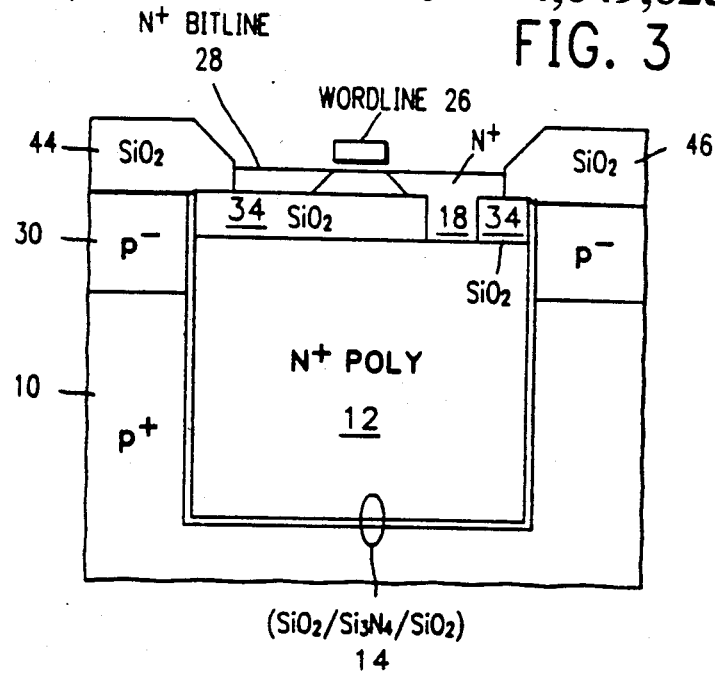

DYNAMIC MEMORY DEVICE HAVING A SINGLE-CRYSTAL TRANSISTOR ON A TRENCH CAPACITOR STRUCTURE AND A FABRICATION METHOD THEREFOR

BACKGROUND OF THE INVENTION

1. Field of the Invention

The present invention relates to dynamic random access memory (DRAM) devices wherein individual cells, including an access transistor and a storage capacitor are formed on a single-crystal semiconductor chip, and more particularly to a three-dimensional dynamic random access memory (DRAM) device structure with a single-crystal access transistor stacked on top of a trench capacitor and a fabrication method therefor wherein crystallization seeds are provided by the single-crystal semiconductor area surrounding the cell and/or from the vertical sidewalls of the trench and wherein the access transistor is isolated by insulator.

2. Description of the Prior Art

The following references are typical of the state of the art of DRAMs with trench capacitors.

U.S. Pat. No. 4,353,086 issued Oct. 5, 1982 to Jaccodine et al entitled SILICON INTEGRATED CIRCUITS describes a dynamic random access memory in which individual cells, including an access transistor and a storage capacitor, are formed in mesas formed on a silicon chip. The access transistor of the cell is formed on the top surface of the mesa and one plate of the storage capacitor of the cell is formed by the sidewall of the mesa and the other plate by doped polycrystalline silicon which fills the grooves surrounding the mesas isolated therefrom by a silicon dioxide layer. By this geometry, large storage surfaces, and so large capacitances, can be obtained for the capacitor without using surface area of the chip. In other embodiments, the mesas may include other forms of circuit elements.

U.S. Pat. No. 4,327,476 issued May 4, 1982 to Iwai et al entitled METHOD OF MANUFACTURING SEMICONDUCTOR DEVICES describes a method which comprises the steps of: forming at least one groove at a given location of a semiconductor substrate; laying an insulating film over the entire surface of the semiconductor substrate including the groove; depositing conductive material on the insulating layer to a thickness greater than half the width of an opening of the groove; and forming a MOS capacitor electrode of the conductor layer left in the groove by etching the deposited conductor layer until the insulating film other than its portion within the groove is exposed.

U.S. Pat. No. 4,462,847 issued July 31, 1984 to Thompson et al entitled FABRICATION OF DIELECTRICALLY ISOLATED MICROELECTRONIC SEMICONDUCTOR CIRCUITS UTILIZING SELECTIVE GROWTH BY LOW PRESSURE VAPOR DEPOSITION describes a method for the fabrication of microelectronic semiconductor circuits, including the concurrent low pressure deposition of monocrystalline and polycrystalline semiconductor material in a predetermined pattern. A dielectric isolated circuit is fabricated, by such selective epitaxial growth, and a subsequent oxidation of both the mono- and polycrystalline deposits. By controlling the ratio of the deposition rates, and by controlling the oxidation step, the poly deposit is substantially fully converted to oxide, while the mono is only partly oxidized, leaving a substantially coplanar, isolated matrix of passivated monocrystalline areas in which to fabricate circuit components for interconnection.

In Japanese Pat. No. 58-137245, a technique is described to increase the area of an electrode without increasing the area of a plane by using the sidewall section of a groove dug into an Si substrate as the electrode surface of a capacitor. A field $SiO_2$ film is formed selectively onto a Si substrate through a LOCOS method, an etched groove is formed into the substrate and a capacitor insulating film made of $Si_3N_4$ is shaped onto these surfaces through a CVD method. The whole surface of the insulating film is coated with a plate represented by polycrystalline Si. A groove is buried with the same polycrystalline Si at that time. The plate is oxidized and a first inter-layer oxide film is formed, the $Si_3N_4$ film and an $SiO_2$ film are removed while using the oxide film as a mask, and a gate oxide film is formed through oxidation. A predetermined section is coated with a word line, and source-drain layers are formed to a section not coated with the plate and the gate through ion implantation, and a second inter-layer insulating film and the electrode are coated selectively.

SUMMARY OF THE INVENTION

An object of the present invention is to provide an improved DRAM device structure and fabrication process.

Another object of the present invention is to provide an improved one-transistor dynamic random-access-memory cell structure which has a single-crystal transistor stacked on top of a trench capacitor.

A further object of the present invention is to provide a fabrication method for a DRAM device to make the access transistor in single-crystal bulk or film material without using any recrystallization technique.

Still another object of the present invention is to provide a structure and fabrication method for a three-dimensional DRAM cell with a silicon-on-insulator access transistor and a trench capacitor wherein crystallization seeds are provided by the silicon area surrounding the cell and from the vertical sidewalls of the trench and wherein the access transistor is isolated by oxide.

The foregoing and other objects, features and advantages of the invention will be apparent from the following more particular description of the invention as illustrated in the accompanying drawings.

BRIEF DESCRIPTION OF THE DRAWINGS

FIG. 3 is a schematic illustration of a cross section of another embodiment of a three-dimensional DRAM device fabricated from film material according to the principles of the present invention.

FIG. 4 is a schematic illustration of a cross section of a further embodiment of a three-dimensional DRAM device including a p-channel access transistor located inside an n-well in CMOS technology.

DESCRIPTION OF THE INVENTION

Figure 1:
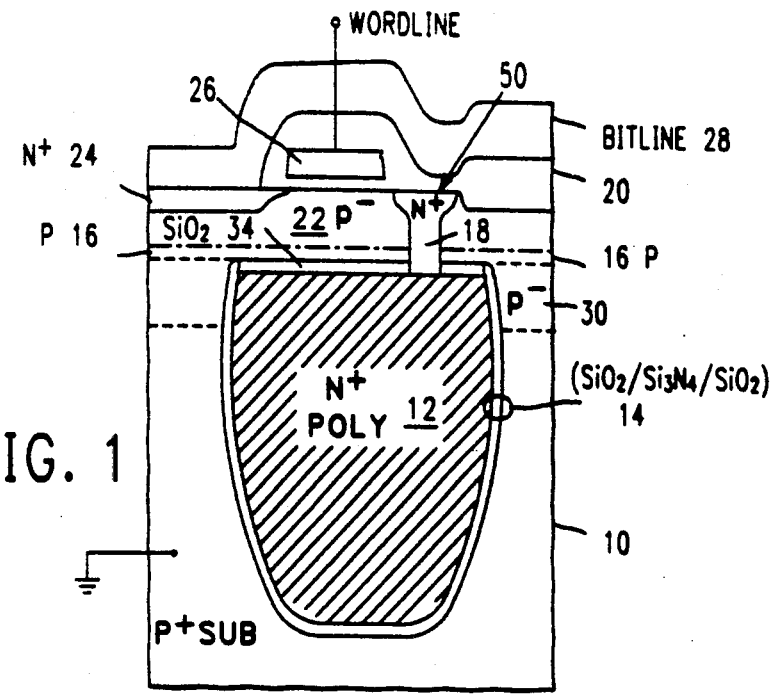
FIG. 1 is a schematic illustration of a cross section of an embodiment of a three-dimensional DRAM device fabricated from bulk material according to the principles of the present invention.
Figure 2:
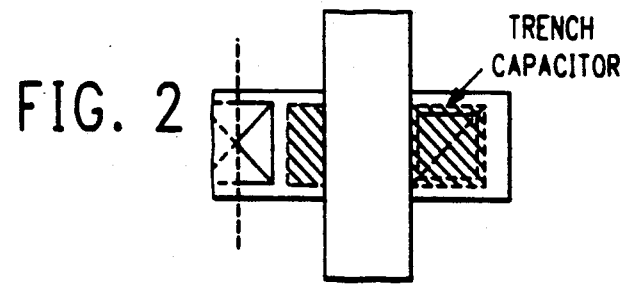
FIG. 2 is a schematic drawing of a detail of the top view of the DRAM device in FIG. 1 illustrating the trench capacitor.

FIG. 1 illustrates a cross section view of a DRAM device including a silicon substrate 10 which, for the purposes of explanation, is P+ type. A trench is located in substrate 10 containing heavily doped N+ polysilicon 12. A composite film 14 of $SiO_2/Si_3N_4/SiO_2$ is provided for the capacitor storage insulator. A thin layer of $SiO_2$ 34 is disposed over the polysilicon 12. A lightly doped p-type epi silicon layer 30 is located over the substrate and layer 34.

The access transistor for the memory cell is located on top of the trench capacitor. An N+ doped material connects the source region 50 of the transistor to the polysilicon 12 inside the trench. A medium doped p-region 16 on top of the trench surface is provided in case there is any significant amount of leakage current along the trench surface, however, this layer is not a necessary element of the structure.

The remaining elements of the transistor includes the gate 26 connected to the wordline. Bitline 28 is also shown as is the recessed isolation region 20.

Depending on whether the transistor is made in either bulk or film material, two cell structures are shown in FIGS. 1 and 3, respectively.

Stacking the transistor on top of the trench capacitor allows the dynamic RAM cell to be made in just one transistor area. Without stacking, direct scaling down the trench capacitor cell has to squeeze the trench capacitor opening, resulting in a large trench depth-to-width aspect ratio for sufficient charge storage. This makes the trench etching and refilling process very difficult. With stacking, because the trench opening can be as large as the transistor active region, a more relaxed trench depth-to-width aspect ratio can be obtained. Stacking cell also gives several advantages such as smaller bitline capacitance due to smaller dimension along the bitline direction, high noise immunity due to the signal-charge stored inside the trench capacitor, and smooth surface topography. An advantage of the present invention is that it provides a technique that allows stacking a cell which has a single crystal film or bulk transistor on top of the trench capacitor without the usual problems such as recrystallizing polysilicon film into single-crystal material.

As previously stated, the cell structure is shown in FIG. 1. The access transistor is stacked on top of the trench capacitor. The N+ doped material 18 connects the source region 50 of the access transistor to the polysilicon 12 inside the trench. A medium doped p-region 16 right on top of the trench surface is added in case there is any significant amount of leakage current along the trench surface (not mandatory). A similar structure, shown in FIG. 4, can be built for a p-channel access transistor located inside an n-well in a CMOS technology with change of the dopant polarity of transistor source/drain and polysilicon inside the trench from n-type to p-type. One extra process step to form the n-well is required.

The method steps for fabricating the cell structure of FIG. 1 are described as follows.

Step 1. Assuming the silicon substrate 10 having p− epitaxial layer 30 on top of heavily p+ doped wafer (it can be just p+ wafer), a composite layer 14 of $SiO_2$ and $Si_3N_4$ is formed over the p− epi layer. After suitable lithography steps part of this $Si_3N_4/SiO_2$ layer is removed to leave a window such that a trench can be formed in the silicon substrate 10 by RIE (reactive-ion etching)).

Figure 5:
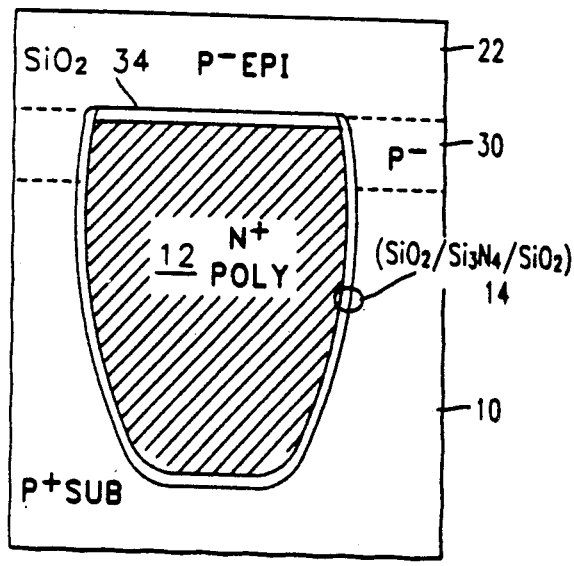
FIGS. 5, 6 and 7 illustrate the structure of FIG. 1 or 2 at various stages in the fabrication process wherein the access transistor is made in the single-crystal bulk region.

Step 2. After a thin oxide layer is thermally grown, a thin nitride layer is deposited and thermally densified in an oxide ambient to form a composite film of $SiO_2/Si_3N_4/SiO_2$ for the capacitor storage insulator layer 14. Then a thick polysilicon film 12 is deposited to fill the trench and is heavily n+ doped as shown in FIG. 5.

Step 3. The polysilicon film 12 is planarized by RIE or mechanical-and-chemical polishing technique such that the surface of poly is lined up with the substrate surface. The nitride layer over the substrate surface is used for etch stop.

Step 4. Then a thin silicon oxide layer 34 is thermally grown "locally" over the polysilicon surface. No oxide is grown on the other regions because the other substrate surface is covered by the nitride layer.

Step 5. The nitride layer over the substrate is removed by isotropic etching. Then oxide layer is removed on all the substrate surface except oxide 34 on poly. (The oxide grown on poly in step 4 should be much thicker than the oxide underneath the nitride layer grown in step 2.)

Step 6. Then a lightly doped p-type silicon layer 22 is epitaxially grown (FIG. 5). Since all the single-crystal silicon substrate except small trench regions has been exposed to the epitaxial growth, abundant single-crystal seeds are available for both vertical and lateral epitaxy. For the trench regions, as the epi film thickness is made larger than the half size of the trench opening, the single-crystal epitaxial layer can be obtained.

Figure 6:
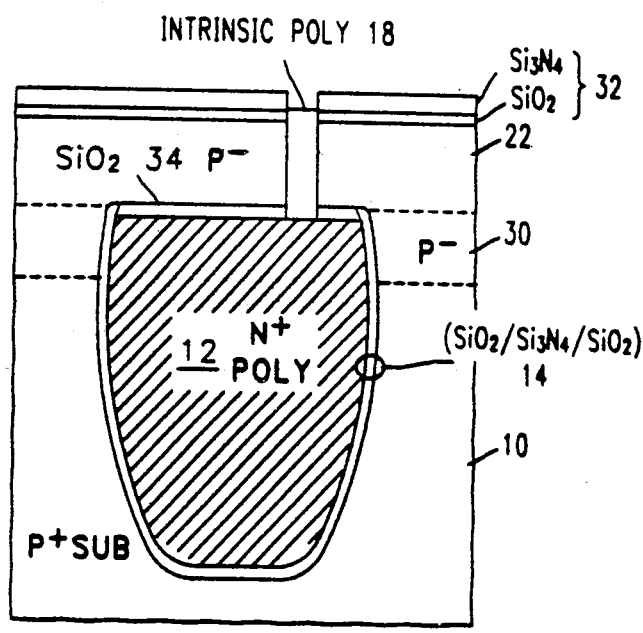

Step 7. A composite layer 32 of $SiO_2$ and $Si_3N_4$ is then formed over the p− epi layer as shown in FIG. 6. After suitable lithography steps part of this $Si_3N_4/SiO_2$ layer 32 is removed to leave a window such that RIE is used to remove the silicon and oxide on top of the trench capacitor 12.

Step 8. Then intrinsic polysilicon film 18 is used to refill the window and is planarized by RIE or mechanical-and-chemical polishing technique such that the surface of intrinsic poly is lined up with the silicon surface of layer 32 as shown in FIG. 6. The nitride part of layer 32 over the silicon surface is used for etch stop. Then remove the nitride and oxide masking layer 32.

Step 9. Then the conventional ROX or shallow trench isolation 20 (FIG. 7) can be used. If the transistor will be made inside the n-well, an n-well implant is needed for the cell region.

Figure 7:
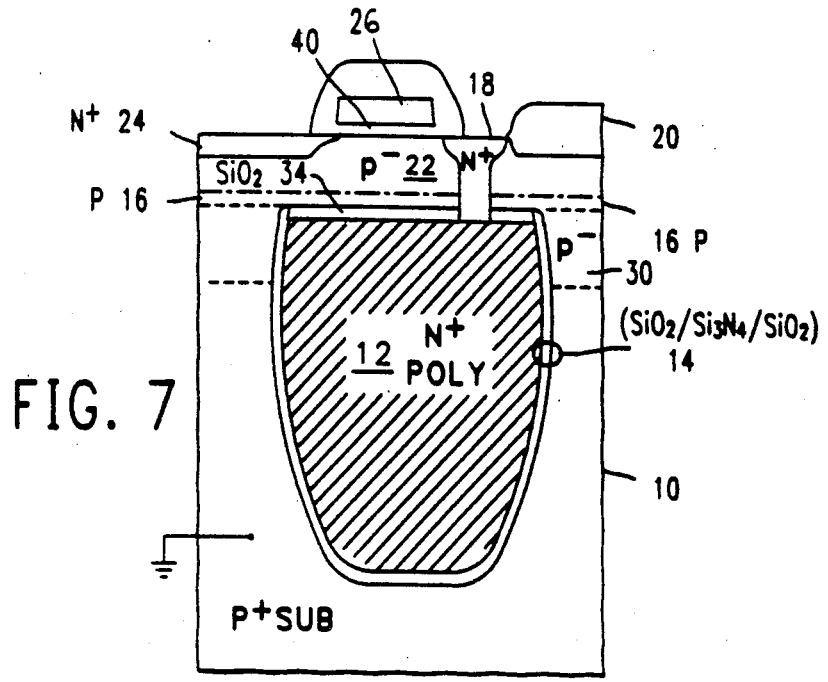

Step 10. After isolation, gate oxide 40 growth, gate 26 definition, and oxide/nitride spacer are formed, the source/drain 24 is formed by a shallow implant of N+ dopants. This implant has to cover the intrinsic polysilicon region 18. Because the intrinsic polysilicon has high diffusivity for the source/drain dopants, after thermal process, the intrinsic polysilicon can be heavily doped, providing the connection for the source region of the access device to the polysilicon inside the trench as shown in FIG. 7. Afterwards, the conventional MOS process is continued to complete the cell structure. The entire process is also fully compatible to CMOS technology.

Figure 8:
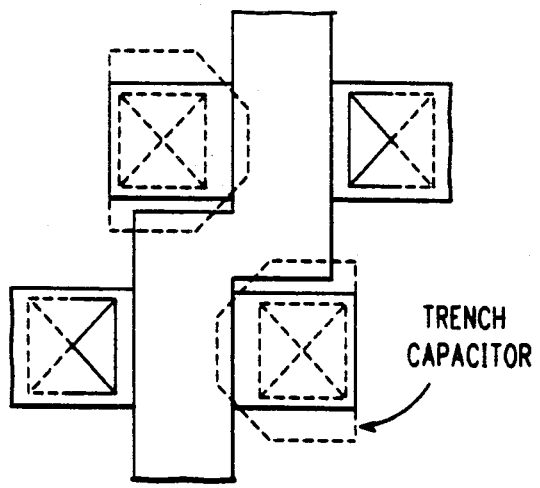
FIG. 8 illustrates a detail of the top view of the access transistor and trench capacitor structure of the device of FIG. 4.

The above process results in a cell structure shown in FIG. 1 or 4 where the access transistor is made in the single-crystal bulk region. The body of the access transistor is directly biased through the epi region 22 by a substrate voltage supply or biased by an n-well voltage supply. From a practical viewpoint, if there is any defect region due to lateral epitaxial growth, this region can be hidden in the source diffusion region and most of the defects are removed in such steps as forming the intrinsic polysilicon plug 18 to the trench capacitor and isolation region (e.g., shallow trench isolation). High-quality epitaxial layer can always be reserved for the channel region of the access transistor (FIG. 8).

Similar principles can be used to realize the cell structure shown in FIG. 3, where the transistor is made in single-crystal film and located even within the trench-capacitor planar boundary by using complete oxide isolation. The fabrication procedures are as follows.

Steps A and B are the same as the previously described steps 1 and 2.

Figure 9:
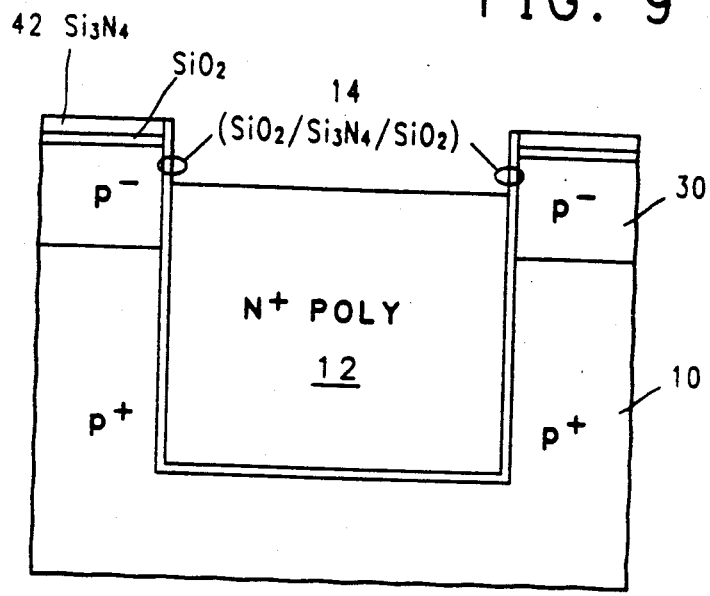
FIGS. 9 and 10 illustrate various stages in the fabrication process for the structure of FIG. 3 wherein the access transistor is made in single-crystal film.

Step C. The polysilicon film 18 is planarized by RIE or mechanical-and-chemical polishing technique such that the surface of the poly is "below" the substrate surface as shown in FIG. 9. The nitride layer 42 over the substrate surface is used for etch stop.

Steps D and E are the same as steps 4 and 5 previously described.

Figure 10:
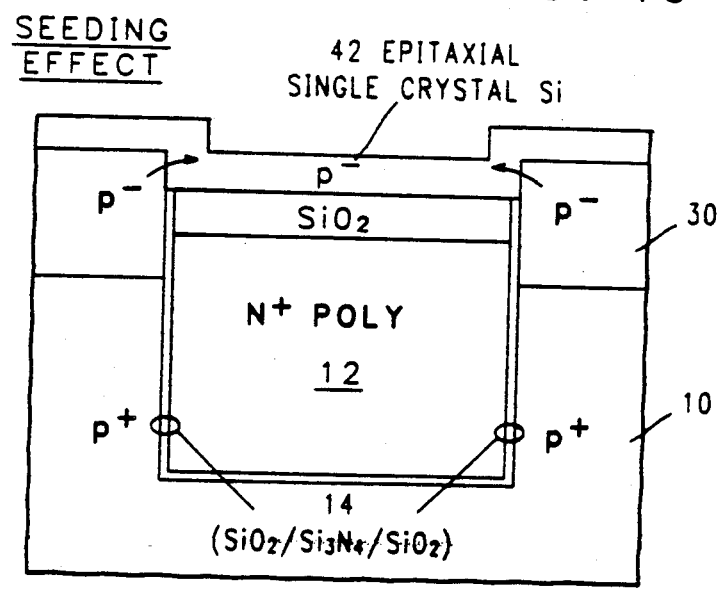

Step F. Then a lightly doped p-type silicon layer is epitaxially grown as shown in FIG. 10. Since all the single-crystal silicon substrate and the silicon sidewalls above the oxide layer in the trench except small trench-oxide regions have been exposed to the epitaxial growth, abundant single-crystal seed are available for both vertical and lateral epitaxy. For the trench regions, as the epi film thickness is made larger than the half size of the trench opening, the single-crystal epitaxial layer 52 can be obtained.

Steps G and H are the same as steps 7 and 8 previously described.

Step I. Then the conventional ROX or shallow trench isolation can be used. Referring to FIG. 3, a complete oxide isolation 44 and 46 can be used to fully isolate the access transistor film which is located within the trench capacitor planar boundary. Although the body of transistor can be not directly biased, by making the transistor film thin enough, no significant Kink effect can affect the cell operation.

Step J is the same as step 10 previously described. FIG. 3 shows the final cell structure where the access transistor is fully isolated by oxide, resulting in small parasitic capacitance.

What has been described is a new one-transistor dynamic memory cell structure which has a "single-crystal" transistor in either bulk or film material stacked on top of a trench capacitor. The single-crystal is obtained directly from epitaxy instead of invoking any recrystallization process.

What has also been described is a new processing method to allow growing single-crystal material on top of the trench capacitor which is not composed of single-crystal material. The key point of this new method is to expose the silicon region surrounding the trench capacitor to provide sufficient seeding area for epitaxial growth over the trench capacitor. This enables different kinds of devices including horizontal and vertical transistors, diodes, resistors, etc., to be made in single crystal and stacked directly on top of the trench capacitor.

Having thus described our invention, what I claim as new, and desire to secure by Letters Patent is:

1. A method for fabricating a dynamic memory cell having a single-crystal transistor device on a trench capacitor structure comprising the steps of
   Step 1. forming a mask layer on a single-crystal silicon substrate;
   Step 2. opening a window in said mask layer and etching a trench in said substrate beneath said window;
   Step 3. filling said trench with polysilicon material and doping said polysilicon material;
   Step 4. forming a layer of oxide over said polysilicon filled trench;
   Step 5. removing said mask layer from said substrate;
   Step 6. growing a doped epitaxial single-crystal silicon layer over said substrate and oxide covered trench regions;
   Step 7. forming a mask layer over said epitaxial silicon layer;
   Step 8. opening a window in said mask layer over said trench region and etching away said epitaxial silicon and oxide over said trench;
   Step 9. refilling said window formed in step 8 with polysilicon material;
   Step 10. removing said mask layer formed in step 7;
   Step 11. forming an access transistor device over said trench by conventional gate oxide growth and definition, and source/drain dopant implantation.

2. A method according to claim 1 wherein said epitaxial layer grown in Step 6 is grown from single-crystal seeds from said single-crystal substrate to provide a single-crystal epitaxial layer, and
   wherein said access transistor device formed in Step 11 is composed of said single-crystal material.

3. A method according to claim 2 wherein said single-crystal silicon substrate is a heavily p+ doped wafer.

4. A method according to claim 2 wherein said single-crystal substrate further includes a p− epitaxial layer disposed on top of said heavily p+ doped wafer.

5. A method according to claim 2 wherein said mask layer formed in Step 1 is a composite layer of silicon oxide and silicon nitride.

6. A method according to claim 2 wherein a composite layer of silicon oxide and silicon nitride on silicon oxide is formed on the surfaces of the trench etched in Step 2 prior to filling said trench with polysilicon material in Step 3, said composite layer providing an insulation layer for trench capacitor storage.

7. A method according to claim 2 wherein said access transistor from Step 11 further includes heavily doping said polysilicon material refilled in Step 9 for providing a connection from the source of said access transistor to said polysilicon material in said trench.

* * * * *